(12) United States Patent
Kliewer et al.

(10) Patent No.: US 7,206,238 B2
(45) Date of Patent: Apr. 17, 2007

(54) INTEGRATED SEMICONDUCTOR MEMORY COMPRISING AT LEAST ONE WORD LINE AND METHOD

(75) Inventors: Joerg Kliewer, Munich (DE); Herbert Benzinger, Munich (DE); Stephan Schroeder, Munich (DE); Manfred Proell, Dorfen (DE)

(73) Assignee: Infineon Technologies AG, Munich (DE)

(*) Notice: Subject to any disclaimer, the term of this patent is extended or adjusted under 35 U.S.C. 154(b) by 1 day.

(21) Appl. No.: 11/218,913

(22) Filed: Sep. 1, 2005

(65) Prior Publication Data
US 2006/0056266 A1    Mar. 16, 2006

(30) Foreign Application Priority Data
Sep. 1, 2004    (DE) .................. 10 2004 042 362

(51) Int. Cl.
*G11C 29/00* (2006.01)
*G11C 8/00* (2006.01)
(52) U.S. Cl. .................. 365/201; 365/230.06
(58) Field of Classification Search .......... 365/201, 365/230.06, 200, 49
See application file for complete search history.

(56) References Cited

U.S. PATENT DOCUMENTS

| | | | | |
|---|---|---|---|---|
| 5,602,784 A | * | 2/1997 | Kojima et al. | 365/189.09 |
| 5,761,135 A | * | 6/1998 | Lee | 365/189.11 |
| 6,570,793 B2 | * | 5/2003 | Stender | 365/200 |
| 6,687,146 B2 | | 2/2004 | Kurjanowicz et al. | |
| 7,085,175 B2 | * | 8/2006 | Remington et al. | 365/189.09 |

* cited by examiner

*Primary Examiner*—Anh Phung
(74) *Attorney, Agent, or Firm*—Slater & Matsil, L.L.P.

(57) ABSTRACT

A semiconductor memory and a test method for testing whether word line segments (12) are floating after an activation operation or a deactivation operation is disclosed. For this purpose, the charge-reversal current (I) that occurs in the event of a word line segment (12) being subjected to charge reversal or a charge quantity (Q) which is fed to the word line (12) or conducted away from the word line segment (12) as a result of this is measured. If, upon activation or deactivation of a word line segment (12), the measured charge-reversal current (I) or the corresponding charge quantity (Q) is less than a lower limit value, it is ascertained that the relevant word line segment (12) has a defective contact terminal. In this way, high-impedance or defective contact hole fillings can thereby be identified and the associated word line segments (12) can be replaced by redundant word lines.

16 Claims, 7 Drawing Sheets

FIG 9

Provision of a semiconductor memory 1 comprising segmented word lines 10 and comprising measuring devices 30 for measuring charge-reversal currents Ia, Id when word line segments 12 connected to driver segments 20 are subjected to charge reversal, and provision of an evaluation device 40

↓

Contacting of the semiconductor memory 1 by the evaluation device 40

↓

Provision of a first electrical potential Vpp for a driver segment 20 for the activation of a first word line segment 12, a charge-reversal current Ia being measured by the measuring device 30 and being forwarded to the evaluation device 40

↓

Evaluation of the measured charge-reversal current Ia in the evaluation device 40

↓

Provision of a second electrical potential Vnwll for a driver segment 20 for the deactivation of the first word line segment 12, a charge-reversal current Id being measured by the measuring device 30 and being forwarded to the evaluation device 40

↓

Evaluation of the measured charge-reversal current Id in the evaluation device 40

↓

Detecting with the aid of the evaluation device 40 whether or not the first word line segment 12 is floating

↓

Measurement of charge-reversal currents during the successive charge reversal of further word line segments connected to the first driver segment

↓

Measurement of charge-reversal currents during the successive charge reversal of further word line segments connected to other driver segments

INTEGRATED SEMICONDUCTOR MEMORY COMPRISING AT LEAST ONE WORD LINE AND METHOD

This application claims priority to German Patent Application 10 2004 042 362.8 which was filed Sep. 1, 2004, and is incorporated herein by reference.

TECHNICAL FIELD

The invention relates to an integrated semiconductor memory comprising at least one word line. The invention furthermore relates to a method for testing such a semiconductor memory.

BACKGROUND

In integrated semiconductor memories, digital information items are stored in a multiplicity of memory cells that are each connected to a bit line and to a word line. Volatile semiconductor memories, in particular DRAM (dynamic random access memory), have memory cells each having a selection transistor and a storage capacitor. The storage capacitor may be formed as a trench capacitor or as a stacked capacitor and the selection transistor may be formed in particular as a MOSFET (metal oxide semiconductor field effect transistor). One electrode of the storage capacitor is connected to one source/drain region of the selection transistor. The other source/drain region is connected to a bit line. The gate electrode is connected to the word line and at the same time forms a word line section. The gate electrode is isolated from a channel region of the selection transistor by a gate oxide. A multiplicity of selection transistors are connected to each word line.

Present-day semiconductor memories generally have segmented word lines each having a main word line (the master word line) and a multiplicity of word line segments connected to the main word line. The word line segments are usually formed from polysilicon and form the gate electrodes of the connected selection transistors. In general, the same number of selection transistors is connected to each word line segment of a word line. The metallic main word line has a greater electrical conductivity than the word line segments made of polysilicon. In order to be able to dimension the main word line such that it is wider for the sake of further improved conductivity, it is often connected to a plurality of rows of word line segments, for instance two rows of word line segments running one beside the other. As a result, it is possible to reduce the number of master word lines in relation to the number of word line segments.

The metallic main word line serves for rapidly transmitting the word line potentials to all connected selection transistors. On account of the increasing miniaturization of structure elements of modern semiconductor circuits and on account of the ever greater transmission speeds and clock frequencies, the word line segments are nowadays driven actively in order to achieve faster switching of the selection transistors connected to the word lines. In this case, in addition to a word line driver to which the main word line is connected, a driver segment is also provided for each word line element, which driver segment supplies the respective word line segment (and also in each case a word line segment of further adjacent word lines) directly with the respective word line potential. From the multiplicity of driver segments, the word line potential passes to all connected selection transistors more rapidly than if only the end of the master word line is connected to the word line potential. The potential provided for activating a word line is usually designated by Vpp and the potential provided for deactivating the word line is usually designated by Vnwll. If a segmented word line is driven actively, these two potentials are in each applied directly to all word line segments of the word line that is to be activated or to be deactivated.

On account of manufacturing tolerances, the electrical connections between the word line segments and the main word line may be at high impedance or completely interrupted, so that an individual word line segment cannot be brought, or cannot be brought rapidly enough, to the envisaged word line potential. Defective electrical connections may arise, for example, as a result of high-impedance contact hole fillings that connect a word line segment to the main line. In the case of a word line that is driven actively, there are even two contact hole fillings provided between a word line segment and the main word line. Within the driver segments of the word line driver, too, defective or high-impedance electrical connections such as contact hole fillings can prevent the word line segment that is to be driven from being supplied with the respective word line potential.

By way of example, it may happen that, on account of defective contact hole fillings within a driver segment, although the word line segment can be activated, it cannot be deactivated, or vice versa. Such circuit defects are based on production tolerances, particularly in the lithographic patterning of contact holes, if lateral positional errors occur for example during the production of etching masks, as a result of which conductive structures that are to be arranged one on top of the other are not connected to one another with sufficiently low impedance. Furthermore, surface alterations of produced conductive structures, contaminants or other influences may lead to electrical decoupling of individual word line segments.

Such word line segments, which are not supplied, or are not supplied rapidly enough, with the respective word line potential are influenced by electrical potentials in their vicinity after the end of the activation operation or deactivation operation and assume a fluctuating or "floating" potential, which is adapted to the respective ambient potential and is virtually unforeseeable. The selection transistors connected to these floating word line segments then switch in an uncontrollable manner, as a result of which the charges stored in the connected storage capacitors can pass onto the bit lines. This leads to read-out errors when reading from other, actually intact memory cells. Consequently, on the basis of a test pattern of tested memory cells, it is not possible reliably to localize which word line segments are floating.

Furthermore, in the case of segmented word lines that are driven segment by segment with the aid of driver segments, the localization of floating word lines is made more difficult when only one of the word line potentials Vpp and Vnwll to be provided is not fed, or is not fed rapidly enough, to the word line segment. This is caused by the design of the driver segments, which have an inverter comprising a pFET transistor and an nFET tranistor, of which one transistor is connected to the potential Vpp and the other transistor is connected to the potential Vnwll. The potential fed to the main word line turns on one of the two transistors, so that the connected word line segment ideally immediately assumes the envisaged potential. However, if one of the two transistors has no or only a high-impedance electrical connection to the word line segment, either only the activation or the deactivation of the word line segment functions.

SUMMARY OF THE INVENTION

In one aspect, the present invention identifies floating word lines or word line sections, in particular word line segments, more reliably than heretofore and in particular to enable a reliable identification of floating word lines or word line segments as early as at the time of an activation operation or deactivation operation. The intention is to provide a semiconductor memory and a test method in which the fact of whether and which word lines or word line segments are floating can be checked in a simple manner. The test method is intended to be more reliable than conventional test methods and in particular to function independently of read-out results of memory cells.

In a first embodiment, an integrated semiconductor memory includes at least one word line and a multiplicity of memory cells. The memory cells each have a selection transistor coupled to the at least one word line. A word line driver is provided. The word line driver optionally provides a first electrical potential or a second electrical potential for the word line. The word line is activated when it is coupled to the first electrical potential, and is deactivated when it is coupled to the second electrical potential. A measuring device is also provided. In the event of the first potential or the second potential being provided, the device measures a charge-reversal current or a charge quantity fed to the word line or conducted away from the word line as a result of a charge-reversal current.

Embodiments are based on the idea of measuring electrical signals that occur during the activation or deactivation of a word line for charge reversal, that is to say for changing the electrical potential of the word line or a word line segment, and evaluating their magnitude in order to quantitatively determine the change that has actually occurred in the electrical potential of the word line or a word line segment. This exploits the fact that each word line segment or each word line has a specific capacitance, so that, in the event of a change in the electrical potential, a specific charge quantity is necessary if the desired potential change is to be effected over the entire word line segment or a different part of the word line. In the case of word line segments that are not connected or are only connected with high impedance, the potential change either does not take place at all or takes place only in a delayed manner, so that, within a short time window provided for the measuring operation according to embodiments of the invention, only a part of the charge, which would correspond to the desired potential change, flows into the word line segment or from the word line segment. A smaller charge-reversal current intensity occurs in the case of high-impedance or defective electrical connections of the word line segments than in the case of a low-impedance, intact connection of a word line segment. Consequently, according to embodiments of the invention, floating word lines or word line sections, in particular word line segments, can be identified with the aid of a measurement of charge-reversal currents or charge transfers that occur on account of charge-reversal currents.

Consequently, embodiments of the invention involve measurement of an on-chip signal for the activation or deactivation of a word line or a word line segment in order to identify floating word line regions. Conventionally, by contrast, an electrical functional test is always carried out, in which the electrical switching behavior of the memory cells connected to the word lines is checked. This involves attempting to determine which word lines or word line segments are defective from the position of defective memory cells on the semiconductor chip. By contrast, the method according to embodiments of the invention has the advantage that floating word line sections can be identified even without an electrical functional test, which tests the switching behavior of the memory cells. The number of word line segments on a semiconductor chip is a multiple less than the number of memory cells on a semiconductor chip, so that a considerable time gain is achieved in the identification of floating word line sections. Moreover, the test method according to embodiments of the present invention is substantially more reliable than conventional tests.

It is preferably provided that the measuring device has a first measuring unit, which measures a charge-reversal current when the word line is activated, and a second measuring unit, which measures a charge-reversal current when the word line is deactivated. The first and the second measuring units measure a charge-reversal current during the activation and during the deactivation, respectively, of a word line. In this case, the measuring units measure either a charge-reversal current or a charge quantity produced on account of the charge-reversal current owing to the charge transfer. In particular, the measuring units can measure charge-reversal currents or charge quantities that arise as a result of the charge reversal of, in each case, only one word line segment.

As an alternative to this, it is also possible to measure charge-reversal currents or charge transfers that are produced as a result of charge reversal of the entire word line. In one aspect, the actual and not just the expected change in charge of a word line or a word line segment is evaluated in order to assess the quality of the electrical contact connection of the word line or the word line section. In the case of the embodiment described here, a dedicated measuring unit is in each case provided for each charge-reversal operation, namely for the activation operation and for the deactivation operation. A measurement result, for example the measured charge-reversal current or the measured charge quantity, can be forwarded by the respective measuring unit in order to enable the evaluation of the measurement result and the assessment of the quality of the tested word line or the tested word line segment.

It is preferably provided that the first measuring unit and the second measuring unit in each case have an ohmic resistor, through which a charge-reversal current flows in the event of the word line being subjected to charge reversal, the measuring units measuring a voltage drop across the respective ohmic resistor. The ohmic resistor may be arranged in a section of a line via that the potential Vpp or the potential Vnwll is passed to a word line segment. Preferably, at least two leads are provided, which are used to provide in each case one of the two potentials Vpp and Vnwll for the word line segment.

It is preferably provided that a measured charge-reversal current or a measured charge quantity that is fed in or conducted away on account of a charge-reversal current is amplified by the measuring device and forwarded to at least one external contact terminal of the semiconductor memory. The external contact terminal may be a "bonding pad", that is to say a contact terminal that is exposed on the chip area and can be contact-connected in order to read out and assess the charge-reversal current or the charge quantity as measurement result.

Furthermore, it is preferably provided that at least one switching element is provided, which enables the forwarding of a measured charge-reversal current or a measured charge quantity to the at least one contact terminal in a test operating mode of the semiconductor memory and prevents it in a normal operating mode of the semiconductor memory. Such switching elements, as may be formed as field effect transistors for example, may for example be in the on state in a test operating mode and then forward measurement results to the at least one contact terminal upon activation or deactivation of a word line or a word line segment. The measurement results are read out and assessed preferably with the aid of a contact head, as is already conventionally used for testing integrated semiconductor memory chips. Such contact heads have a multiplicity of test needles that are placed onto the contact terminals of an integrated semiconductor memory. With the aid for example of a respective contact terminal for the read-out of measurement results for activation operations and for the read-out of measurement results for deactivation operations, it is possible to assess whether and, if appropriate, which word line segments of the semiconductor memory are defective and are thus floating.

It is preferably provided that the at least one word line has a main word line and a plurality of word line segments coupled to the main word line. Selection transistors of a multiplicity of memory cells are coupled to each word line segment.

In particular, it is provided that each word line segment is coupled to the main word line via at least one contact hole filling. It is precisely in the case of segmented word lines that the risk of floating word line segments is particularly high on account of the large number of contact hole fillings that are intended to produce a low-impedance connection between the main word line and a word line segment.

It may furthermore be provided that the word line driver has a multiplicity of driver segments, and that each word line segment is coupled via a first contact hole filling to a driver segment that actively drives the word line segment, and each driver segment is coupled via a second contact hole filling to the main word line. With this design, too, each word line segment is electrically connected via at least one contact hole filling and may be floating in the event of a contact connection having excessively high impedance.

It is preferably provided that a dedicated measuring device is provided for each driver segment, which measuring device is formed at a section of leads by means of which the first and the second electrical potential are fed to the respective driver segment. Particularly, a ohmic resistor, which, if a charge-reversal current flows through it, causes a voltage drop, can be integrated into a lead easily and in a space-saving manner. In particular, two leads each with a ohmic resistor may be provided for measuring charge-reversal currents. One lead provides the activation potential Vpp and the other lead provides the deactivation potential Vnwll.

It is preferably provided that the semiconductor memory has a multiplicity of word lines that are combined in groups of word lines, the word lines of a group being driven by the same driver segments, and a driver segment in each case driving a single word line segment of each word line of the group of word lines. A group of word lines thus includes those word lines whose word line segments are driven by the same amount of driver segments. Each driver segment runs on a semiconductor chip perpendicularly to the preferred direction of word lines. Memory segments and memory cell arrays are arranged in an alternate sequence along the preferred direction of a word line. The memory cells are provided in a dense spatial arrangement in the memory cell arrays. The selection transistors of the memory cells are connected to the word line segments that extend over the memory cell arrays in a manner proceeding from the driver segments. Word lines running parallel to one another in the region of an individual memory cell array are driven by the same driver segment at one end of the memory cell array (or else by two different driver segments at opposite ends of the memory cell array). Each driver segment drives at most one word line segment of each word line of the group of word lines.

It is preferably provided that a dedicated measuring device is assigned to each driver segment of a group of word lines, which measuring device measures a charge-reversal current or a charge quantity that is fed in or conducted away as a result of a charge-reversal current if a word line segment of one of the word lines of the group of word lines is activated or deactivated. In this embodiment, a multiplicity of measuring devices are provided which, by way of example, each have a ohmic resistor and an amplifier and are integrated in the leads of all of the memory each have a nonreactive resistor and an amplifier and are integrated in the leads of all of the memory segments. In this case, each measuring device may in turn have two measuring units, a respective one of which is provided for measurement during an activation operation and the other of which is provided for measurement during a deactivation operation.

It is preferably provided that a multiplicity of driver segments are arranged along main word lines of a group of word lines, which driver segments respectively drive a word line segment of each word line of the group and to which driver segments a dedicated measuring device is respectively assigned. Consequently, a driver segment of the word line driver is provided along the course of a main word line in the region of each word line segment. Each driver segment is supplied with the word line potentials Vpp and Vnwll by dedicated leads. Measuring devices that measure a charge-reversal current are provided in the region of all leads for the driver segments. Consequently, each driver segment is provided with a dedicated measuring device.

It is preferably provided that the semiconductor memory has signal lines running between at least one contact terminal, which can be contact-connected for the purpose of reading out the charge-reversal current or a charge quantity that is fed in or conducted away as a result of a charge-reversal current, and the measuring devices, the signal lines branching toward the measuring devices. Consequently, via the signal lines, the measurement results of a multiplicity of measuring devices are brought together to at least one, preferably to at least two contact terminals. In particular, at least one respective contact terminal may be provided for the read-out of a measurement result for an activation operation and at least one contact terminal may be provided for the read-out of a measurement result for a deactivation operation. However, it is also possible to provide a greater number of contact terminals by means of which the measurement results can be read out.

It is preferably provided that the semiconductor memory has selection lines that select that measuring device whose charge-reversal currents to be measured are forwarded to the at least one contact terminal. The selection lines may be control lines that control switching elements, for example field effect transistors. The switching elements may be integrated into the signal lines. Consequently, with the aid of selection lines and the switching elements controlled thereby, it is possible to determine the measuring device, that is to say thus the driver segment, from which a measurement result is read out. Since, furthermore, a specific word line in each case is activated or deactivated in a targeted manner in order to attain a measurement result, it is possible, in conjunction with the knowledge of the driver segment connected to the measuring device effecting read-out, to determine which word line segment of which word line is currently being tested. In this way, all of the word line segments of the semiconductor memory can be tested by, in each case, single activation and deactivation in order to obtain a reliable item of information about floating word line segments.

It is preferably provided that the main word lines are metallic lines and the word line segments are polysilicon lines. The main word lines may for example be produced essentially from aluminum or copper.

Finally, it is preferably provided that the semiconductor memory is a volatile random access memory, in particular a DRAM (Dynamic Random Access Memory).

In another aspect, the invention provides a method for testing at least one word line of an integrated semiconductor memory.

A semiconductor memory has at least one word line and at least one measuring device, which, upon activation or deactivation of the word line, measures a charge-reversal current or a charge quantity that is fed to the word line or conducted away from the word line as a result of a charge-reversal current. An evaluation device is also provided. The contact terminal is contact connected by the evaluation device. Either a first potential for the charge reversal of the word line by activation or of a second potential for the charge reversal of the word line by deactivation is applied. A charge-reversal current or a charge quantity, which is fed to the word line or conducted away from the word line as a result of a charge-reversal current, is measured with the aid of the measuring device. The charge-reversal current or the charge quantity can then be evaluated with the aid of the evaluation device.

In the case of a specific embodiment method, firstly a semiconductor memory according to the invention and also an evaluation device are provided. The evaluation device preferably makes contact with at least one contact terminal of the semiconductor memory in order to read out a charge-reversal current or a charge transfer that occurs in the semiconductor memory when the word line is activated or deactivated. For this purpose, an activation operation or a deactivation operation is carried out. The word line or a section of the word line, for example a word line segment, is subjected to charge reversal during the activation or deactivation operation. As a result of the charge-reversal operation, a charge quantity flows that corresponds to the product of the capacitance of the charge-reversed word line section (including charge-reversed lead sections) and the potential difference between the potentials before and after charge reversal. If, however, the word line section that is to be subjected to charge reversal is electrically connected only with high impedance or is not electrically connected at all, only a smaller or no charge-reversal current at all flows. The respective level of the charge-reversal current is, in all cases, measured in the measuring device and preferably amplified and forwarded to at least one contact terminal that is read by the evaluation device. Finally, in the evaluation device, an evaluation of the measurement result is effected on the basis of the magnitude of the charge-reversal current that has been read out or the charge transfer that has been read out.

Accordingly, it is provided that the fact of whether a section of the word line is connected with sufficiently low impedance is determined in the evaluation device on the basis of the measured charge-reversal current or on the basis of the measured charge quantity.

It is preferably provided that when the measured charge-reversal current or the measured charge quantity is greater than a lower limit value, it is ascertained that the section of the word line is intact.

Furthermore, it is preferably provided that when the measured charge-reversal current or the measured charge quantity is less than a lower limit value, it is ascertained that the section of the word line is floating.

It is preferably provided that the sequence of the application of first or second potentials and evaluation is repeated at least once, the word line being activated the first time these steps are carried out, and being deactivated the second time these steps are carried out, or vice versa. In this embodiment, the charge-reversal current or the charge quantity transferred as a result thereof is measured once respectively for the case of an activation operation and for the case of a deactivation operation. As a result, it is possible in particular to identify those circuit faults that arise in active driver segments as a result of the fact that only one of the transistors of the inverter of a driver segment is defective and the connected word line segments can only be biased with one of the two potentials Vpp and Vnwll.

Furthermore, it is preferably provided that the semiconductor memory has at least two contact terminals that are conductively connected to the measuring device. Charge-reversal currents or charge quantities are read out via a first contact terminal in the event of activation and are read out via a second contact terminal in the event of deactivation. Here provision is made in each case of separate leads for the measuring units and separate signal lines for charge-reversal currents during activation operations and for charge-reversal currents during deactivation operations.

In particular, it is provided that the semiconductor memory has a multiplicity of segmented word lines, each comprising a main word line and comprising a multiplicity of word line segments coupled to the main word line. The word lines in each case are driven segment by segment by driver segments, and each driver segment is assigned a dedicated measuring device. A charge-reversal current is measured for each word line segment for at least, in each case, one activation operation and one deactivation operation. Here the word line section that is subjected to charge reversal is, in each case, a word line segment, assuming a sufficiently low-impedance electrical connection.

Finally, it is preferably provided that the fact of whether the word line segment is floating after an activation operation and whether the word line segment is floating after a deactivation operation is tested for each word line segment of the semiconductor memory. This evaluation is in each case determined in the evaluation device on the basis of the level of the measured charge-reversal current or alternatively on the basis of the level of the transferred charge quantity. In this way, it is possible to test in particular nonvolatile semiconductor memories such as DRAMs, for example.

BRIEF DESCRIPTION OF THE DRAWINGS

The invention is described below with reference to FIGS. 1 to 10, in which:

FIG. 9 shows a schematic flow diagram for a method according to the invention for testing word line segments.

The following list of reference symbols can be used in conjunction with the figures:

| | |
|---|---|
| 1 | Semiconductor memory |
| 2 | Memory cell |
| 3 | Selection transistor |
| 4 | Storage capacitor |
| 6 | Bit line |
| 8 | nFET transistor |
| 9 | pFET transistor |
| 10 | Word line |
| 11 | Main word line |
| 12 | Word line segment |
| 13 | Second contact hole filling |
| 14 | First contact hole filling |
| 15 | Group of word lines |
| 19 | Word line driver |
| 20 | Driver segment |
| 30 | Measuring device |
| 30a | First measuring unit |
| 30b | Second measuring unit |
| 31 | Ohmic resistor |
| 32 | Measuring amplifier |
| 33; 33a, 33b | Lead |
| 34a | Control line |
| 34b | Selection line |
| 35 | Contact terminal |
| 35a | Second contact terminal |
| 35b | First contact terminal |
| 36 | Signal line |
| 37 | Switching element |
| 40 | Evaluation device |
| I; Ia, Id | Charge-reversal current |
| Is | Limit value for the charge-reversal current |
| N | Normal operating mode |
| T | Test operating mode |
| Vnwll | Second potential |
| Vpp | First potential |

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
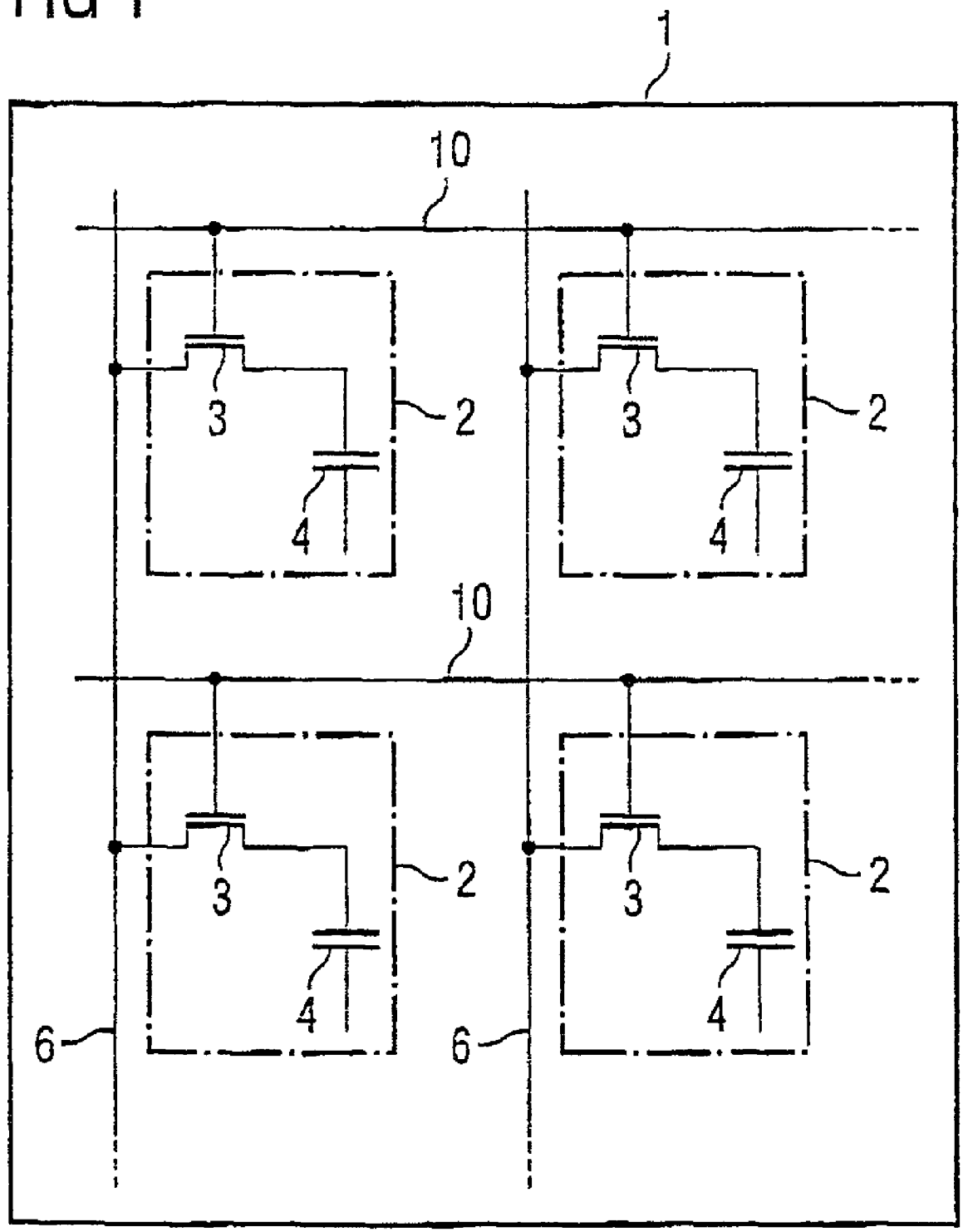
FIG. 1 shows a schematic plan view of an integrated semiconductor memory.

FIG. 1 shows a schematic plan view of an integrated semiconductor memory 1 having a multiplicity of memory cells 2, each comprising a selection transistor 3 and a storage capacitor 4. The storage capacitor 4 may be a trench capacitor or a stacked capacitor. The selection transistor 3 is preferably a MOSFET, the gate electrode of which is formed by the word line 10 to which the selection transistor is connected. A source/drain electrode is coupled to a bit line 6. The word lines 10 may be, in particular, segmented word lines, as explained in greater detail with reference to the subsequent figures.

Figure 2:
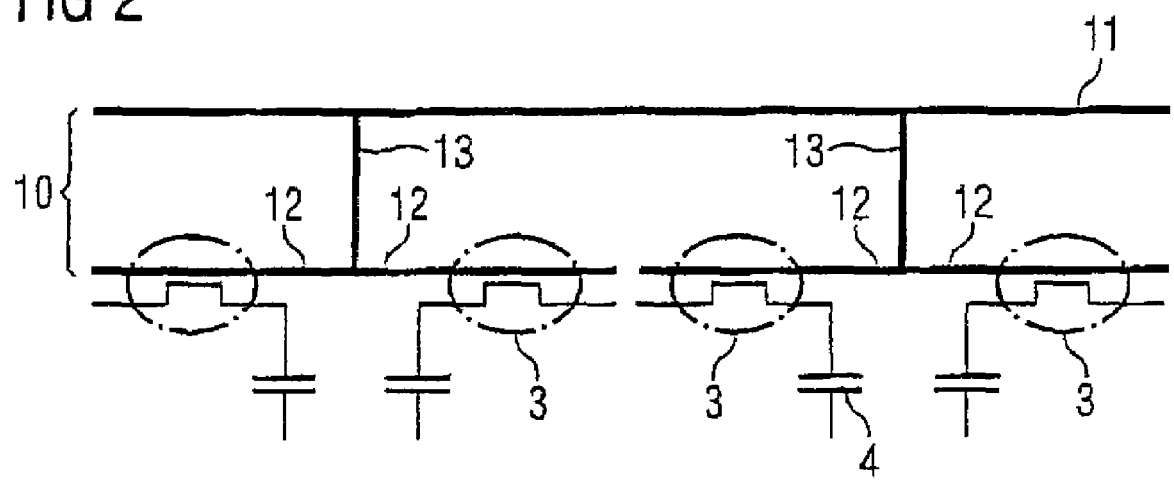
FIG. 2 shows a schematic illustration of a segmented word line.

FIG. 2 shows a schematic illustration of a segmented word line 10 having a metallic main word line 11 and a multiplicity of word line segments 12 made of polysilicon. Each word line segment 12 is coupled to the main word line 11 by a contact hole filling 13 and forms the gate electrodes of the selection transistors 3.

Figure 3:
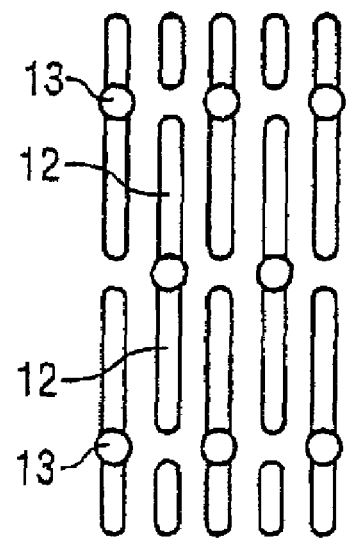
FIG. 3 shows a schematic plan view of the arrangement of word line segments of a plurality of word lines from FIG. 2.

FIG. 3 shows a plan view of an arrangement of segmented word lines in accordance with FIG. 2 at the level of the word line segments 12. In this exemplary embodiment, the word line segments 12 of mutually adjacent word lines are arranged offset with respect to one another in the direction of the main word lines. If one of the contact hole fillings 13 illustrated has high impedance or produces no electrical connection whatsoever to a word line segment 12 as a result of production faults, only a very low or no charge-reversal current at all can flow during the attempt to activate or deactivate the word line segment. This can be identified by means of the current or charge quantity measurement according to embodiments of the invention, as explained further below.

Figure 4:
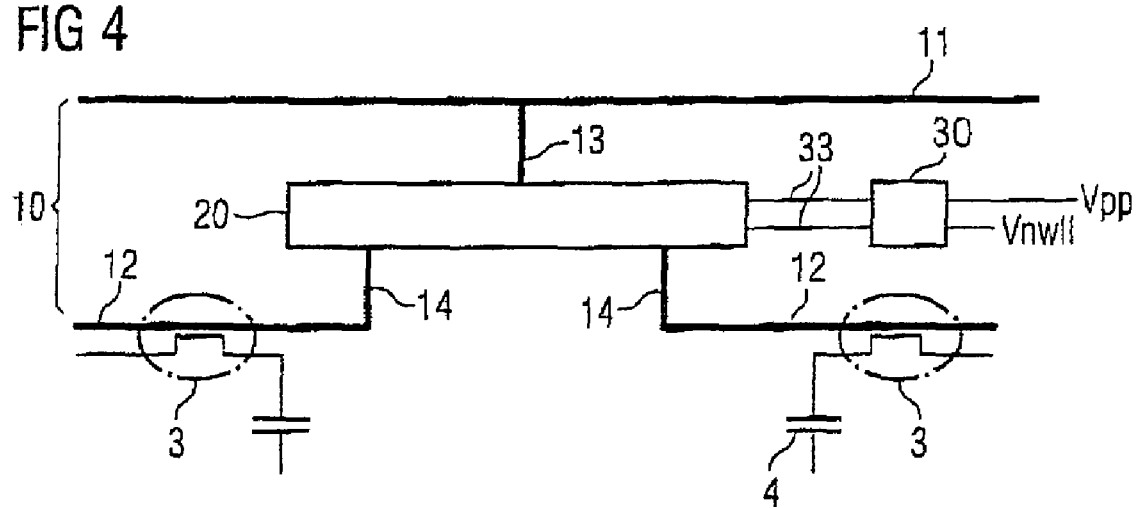
FIG. 4 shows a schematic illustration of a segmented word line with driver circuits.

FIG. 4 shows a schematic illustration of a segmented word line, which is driven actively with the aid of a driver circuit. The word line 10 likewise has a main word line 11 and a multiplicity of word line segments 12 to which selection transistors 3 of memory cells are in each connected. In contrast to FIG. 2, FIG. 4 additionally illustrates a driver segment 20, which is supplied with the word line potentials Vpp and Vnwll with the aid of leads 33. A measuring device 30 according to embodiments of the invention is additionally provided. The measuring device is explained below. In FIG. 4, the word line segments 12 are coupled to the driver segment 20 through first contact hole fillings 14. The driver segment 20 is connected to the main word line 11 through a second contact hole filling 13.

Figure 5:
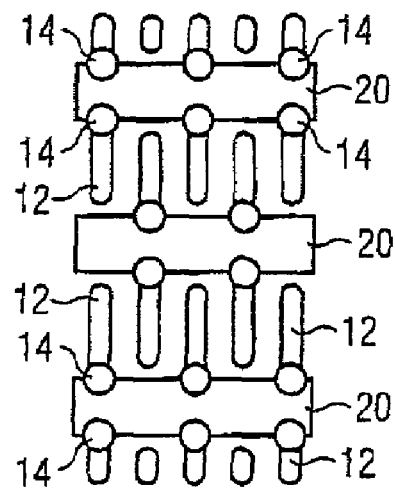
FIG. 5 shows a schematic plan view of the word line segments of a plurality of word lines in accordance with FIG. 4.

FIG. 5 shows a schematic plan view of an arrangement of a plurality of main word lines 11 at the level of a driver segment 20. The main word lines 11 are, in each case, connected to the driver segment 20 through a first contact hole filling 14 and extend over a respective memory cell array arranged between two successive driver segments in each case. The memory cell arrays between the driver segments 20 are not illustrated pictorially in FIG. 5. Furthermore, in the same way as in FIG. 3, the dimensions have not been chosen to scale.

Figure 6:
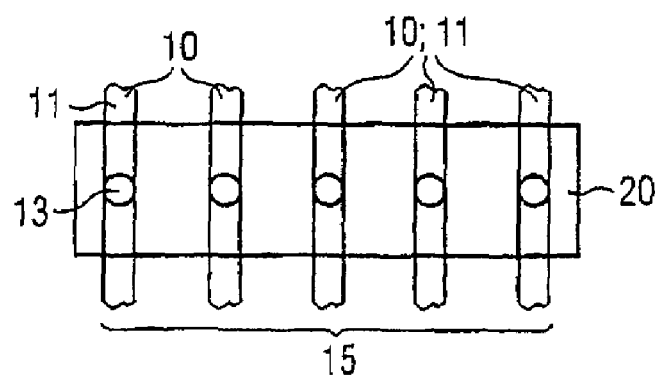
FIG. 6 shows a schematic plan view of an arrangement of a plurality of main word lines at the level of a driver segment.

FIG. 6 shows a plan view of an arrangement of a plurality of main word lines in accordance with FIG. 3 at the level of a driver segment 20. The illustration shows an individual driver segment 20 connected to a plurality of main word lines 11 through second contact hole fillings 13. The word lines 10 with which these main word lines 11 are associated form a group 15 of word lines which are driven by the same amount of driver segments 20. This means that a driver segment 20 in each case drives a word line segment 12 of each word line 10 of the group 15 of word lines.

Figure 7:
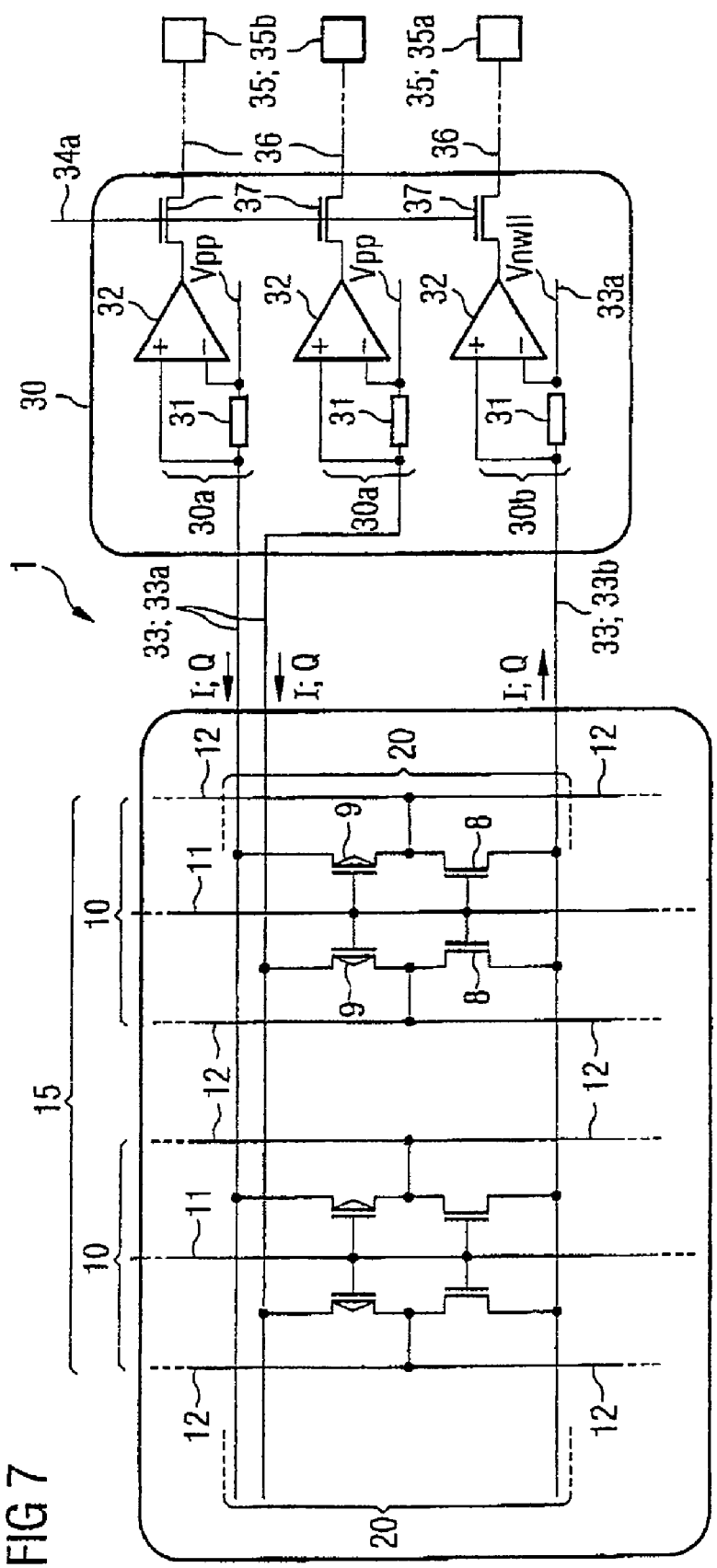
FIG. 7 shows a schematic illustration of a semiconductor memory according to the invention with a measuring device.

FIG. 7 shows a schematic illustration of a semiconductor memory according to embodiments of the invention, which have a measuring device 30 for measuring charge-reversal currents I or charge quantities Q transferred as a result of charge-reversal currents. The left-hand region of FIG. 7 illustrates a subcircuit showing a group 15 of a plurality of word lines 10 in the region of a driver segment 20. Each word line 10 has a main word line 11, to which word line segments 12 are connected via the driver segment 20. In FIG. 7, each main word line 11 is coupled in the region of the driver segment 20 to a total of four word line segments 12, of which in each case two are illustrated running on the left and two on the right of the respective main word line 11. This makes it possible to reduce the number of required main word lines 11 in relation to the number of word line segments that are to be arranged parallel next to one another, so that the main word lines can be made wider and thus with lower impedance. Furthermore, other additional lines, for example signal lines, can then be arranged between the main word lines more easily.

The driver segment 20 has an inverter circuit in the region of each word line segment 12 coupled to a main word line 11. The inverter circuit has a pFET transistor 9 and an NFET transistor 8, which are opened and closed complementarily with respect to one another by means of the respective main word line 11. Consequently, depending on the potential of the main word line 11, either the deactivation potential Vnwll is forwarded via the lead 33b or the activation potential Vpp is forwarded via a lead 33a to the word line segments 12. The word line segments 12 connected to the driver segment 20 are thereby subjected to charge reversal. This means that a charge-reversal current I flows via the leads 33 to the connected word line segments 12. As a result, the charge quantities Q are moved, which are either fed to the connected word line segments 12 or conducted away from them.

According to embodiments of the invention, the integrated semiconductor memory 1 has a measuring device 30, which measures the charge-reversal currents I that occur when the word line segments 12 are subjected to charge reversal. FIG. 7 illustrates an embodiment in which the charge-reversal currents I that occur are measured, amplified and forwarded to contact terminals 35. As an alternative to this, it is also possible to measure the charge transfers caused by the charge-reversal currents, that is to say the charge quantities Q that are fed to the word line segments or conducted away from them. What is desired is that a sufficiently small time window is defined within which the charge measurement or current measurement can be effected in order that, in the case of high-impedance contact hole fillings, it is possible to determine what fraction of the charge quantity provided or of the charge-reversal current actually reaches the driven word line segments within the charge-reversal time. An appropriately small time window should correspond for example at most to the duration of the customary execution of a precharge or activate command.

The test device 30 has ohmic resistors 31 integrated into the leads 33. The leads 33 are connected to the word line potentials Vpp and Vnwll. In the event of a current flow through one of the leads 33, the voltage drop occurring across the respective ohmic resistor 31 is tapped off and amplified by a measuring amplifier 32. The amplified measurement result, for example the amplified charge-reversal current I or the amplified charge quantity Q, is forwarded via signal lines 36 to external contact terminals 35 of the semiconductor memory 1, where they can be read out. Switching elements 37 are integrated into the signal lines 36 and enable the forwarding of the amplified measurement result (I or Q) in a test operating mode T (FIG. 8) of the semiconductor memory 1 and prevent it, by contrast, in a normal operating mode N of the semiconductor memory 1.

The switching elements 37 may be formed as field effect transistors and be jointly switchable for example by means of control lines 34a. As an alternative, the switching elements 37 may in each case be switchable individually, independently of the rest of the switching elements 37, in order to enable the selective forwarding of an individual measurement result.

The test device 30 in accordance with FIG. 7 has a plurality of measuring units 30a, 30b, a first measuring unit 30a being used upon activation of word line segments 12 and a second measuring unit 30b being used upon deactivation of word line segments 12. In addition, the first measuring unit 30a is provided twice in FIG. 7 since, owing to the plurality of word line segments 12 coupled to the same main word line 11 in the region of the driver segment 20, two leads 33a are in each case provided for the activation potential Vpp. However, this is only due to the design and interconnection of the segmented word lines. Therefore, in FIG. 7, a single first measuring unit 30a would also suffice if only one lead 33a is provided for the activation potential.

In accordance with the embodiment in accordance with FIG. 7, each measuring unit 30a, 30b has in each case an ohmic resistor 31 and a measuring amplifier 32 and is coupled to a contact terminal 35 via a switching element 37 and a signal line 36. A plurality of contact terminals 35a, 35b may be provided for the read-out of activation currents and deactivation currents.

Figure 8:
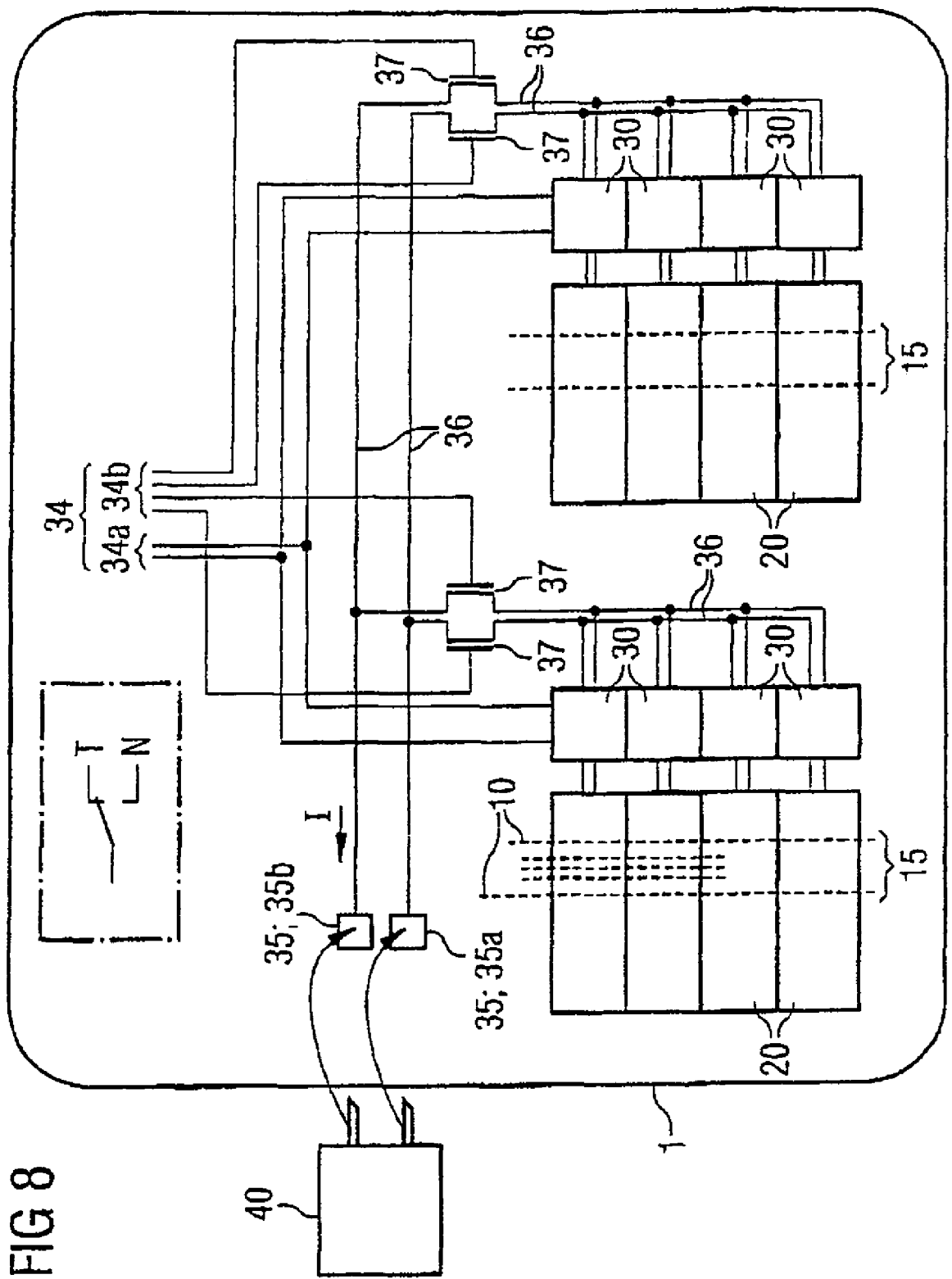
FIG. 8 shows a further schematic illustration of a semiconductor memory according to the invention and an evaluation device.

FIG. 8 shows an integrated semiconductor memory 1 comprising a multiplicity of driver segments 20 that are each assigned a measuring device 30 according to embodiments of the invention. Each measuring device 30 is constructed in the manner illustrated in FIG. 7. In FIG. 8, for the sake of clarity, the line courses are illustrated as if, in each case, only a single measuring unit 30a for measuring activation currents were provided in each measuring device 30. Two groups 15 of word lines 10 are illustrated by way of indication in FIG. 8. The word lines 10 run over a multiplicity of memory segments 20 by means of which, in each case, at least one word line segment of each word line 10 associated with the group 15 is driven provided that the corresponding contact hole fillings have sufficiently low impedance.

Each measuring device 30 is coupled to signal lines 36, of which, in each case, two signal lines 36 per measuring device 30 are illustrated in FIG. 8. To be precise, one for forwarding a measurement result in the case of an activation operation and another for the case of a deactivation operation. Switching elements 37, in particular field effect transistors, are integrated into the signal line 36 and can be opened and closed selectively, that is to say individually and independently of one another, with the aid of control lines 34a. The measurement results of a respective individual measuring device 30 can thereby be forwarded to the contact terminals 35 (bonding pads), whereas at the same time the measurement results of the remaining measuring devices 30 pass only as far as the remaining switching elements 37 that are in the off state. As a result, it is possible to significantly reduce the number of contact terminals 35 required for the read-out of the measurement results in comparison with the number of measuring devices 30.

The signal lines 36 branch toward the measuring devices 30 in a manner proceeding from the contact terminals 35. In principle, all measurement results could be forwarded to a single contact terminal 35, which is then contact-connected with the aid of an evaluation device 40. Preferably, however, at least one contact terminal in each case is provided in order to read out a measurement result in the event of an activation operation (contact terminal 35b) and in the event of a deactivation operation (contact terminal 35a). This means that the measuring devices 30 can also be subdivided internally into measuring units for measuring activation signals and for measuring deactivation signals without interconnects for activation signals and for deactivation signals having to be connected up to one another.

Mating contacts of the evaluation device 40 are placed onto the contact terminals 35a, 35b of the semiconductor memory, so that all measurement results of activation or deactivation operations are detected and assessed in the evaluation unit 40. FIG. 8 furthermore illustrates selection lines 34b, which can be used to select the group 15 of word lines with respect to which the charge-reversal currents or the charge quantities that are conducted away or fed in are, in each case, forwarded to the contact terminals 35. In particular, with the aid of the selection lines 34b it is possible to define the driver segment 20 of a group 15 of word lines with respect to which the measured charge-reversal currents or charge quantities are read out. Which word line segments are subjected to charge reversal and tested is thereby determined at the same time. During a measuring operation, a charge-reversal current I amplified by the respective measuring amplifier then flows to one of the contact terminals 35a, 35b and the level of the amplified charge-reversal current I is then assessed in the evaluation device 40.

FIG. 9 schematically shows a flow diagram for a method according to the invention for testing word line segments. Firstly, an evaluation device 40 and also an integrated semiconductor memory 1 are provided, the semiconductor memory 1 having segmented word lines 10 with word line segments 12 connected to driver segments 20, and also measuring devices 30 for measuring charge-reversal currents when the word line segments 12 are subjected to charge reversal. The semiconductor memory furthermore has contact terminals in order to amplify the charge-reversal currents that are read out and to forward them to the evaluation device. The evaluation device 40 is connected to the semiconductor memory 1 (provided that it is not integrated into the semiconductor memory anyway, as is likewise conceivable, or part of a superordinate structural unit to which the semiconductor memory belongs as well).

A first electrical potential Vpp is then provided for a driver segment 20 in order to activate a first word line segment 12 connected thereto. In this case, a charge-reversal current Ia is measured by the measuring device 30, amplified and forwarded to the evaluation device 40. Afterward, the charge-reversal current Ia is evaluated in the evaluation device 40, this thereby ascertaining whether the tested word line segment 12, after the attempt to activate the latter, is actually activated or is floating instead. Afterward, a second electrical potential Vnwll is provided for the driver segment 20 in order to deactivate the first word line segment 12. In this case, instead of the charge-reversal current in the event of activation (Ia) as previously, a charge-reversal current Id (the charge-reversal current in the event of deactivation) is measured by the measuring device, amplified and forwarded to the evaluation device 40.

The measured charge-reversal current Id is then evaluated in the evaluation device 40. This determines whether the first word line segment 12, upon the attempt to deactivate it, is actually deactivated or is floating instead. Afterward, further word line segments 12 coupled to the driver segment 20 are tested in the same way. The word line segments 12 coupled to the remaining driver segments 20 are then tested in the same way until each individual word line segment of the entire semiconductor memory 1 has been tested.

Figure 10:
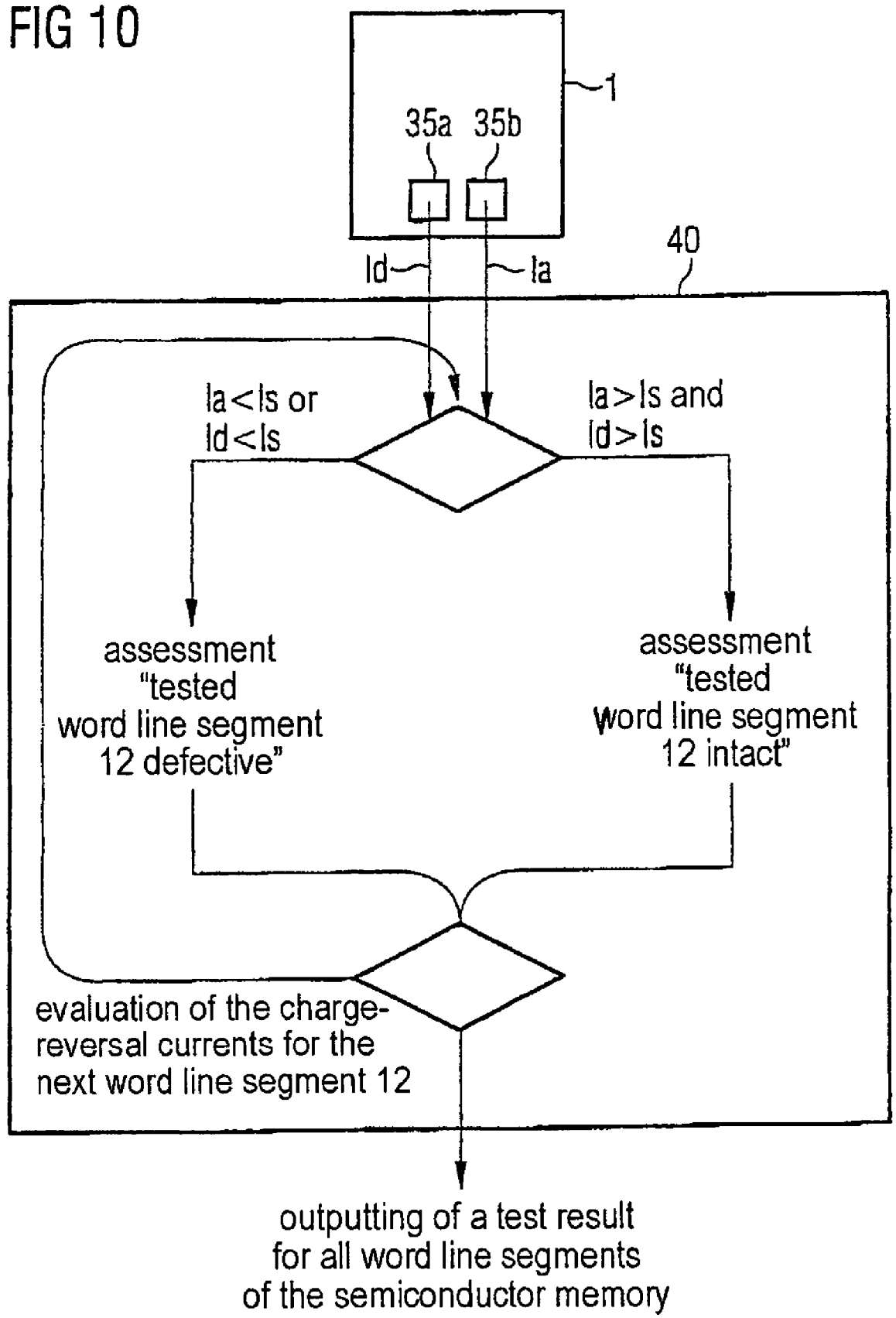
FIG. 10 shows a further flow diagram with method steps of the test method according to the invention that are carried out in an evaluation device.

FIG. 10 shows a further flow diagram with method steps of the test method according to embodiments of the invention that are carried out in an evaluation device, in the case of which the internal assessment process within the evaluation device 40 is illustrated in greater detail. The evaluation device 40 successively receives from the integrated semiconductor memory 1 the charge-reversal currents of all word line segments that have been subjected to charge reversal. The order in which the charge-reversal currents are forwarded can be varied as desired. By way of example, the charge-reversal current Ia for the activation of a specific word line segment 12 and the charge-reversal current Id for the deactivation of the same word line segment 12 may be forwarded one shortly after the other to the evaluation device 40, in which both charge-reversal currents Ia, Id are firstly evaluated before the next word line segment is tested. Preferably, the forwarding of charge-reversal currents Ia for the activation of an arbitrary word line segment is effected via a first contact terminal 35a and the forwarding of charge-reversal currents Id for the deactivation of an arbitrary word line segment 12 is effected via a second contact terminal 35b.

Within the evaluation device 40, the functionality of the tested word line segments is assessed on the basis of the level of the received charge-reversal currents. A predetermined lower limit value Is for the at least required magnitude of the charge-reversal current I, to be precise both for Ia and Id, is stored in the evaluation device 40. The level of the limit value Is is preferably of identical magnitude for both charge-reversal currents. When it is ascertained that both the charge-reversal current Ia for the activation of the word line segment 12 and the charge-reversal current Id upon deactivation of the word line segment 12 are greater than the predetermined limit value Is, the tested word line segment 12 is assessed as intact. Otherwise, if at least one of the two charge-reversal currents Ia, Id is less than the limit value Is, the tested word line segment 12 is assessed as defective. Further word line segments 12 are subsequently assessed in the same way until a test result is present for all word line segments 12 of the semiconductor memory 1. The test result for all word line segments of the semiconductor memory may be output in the form of a test report.

With the aid of the present embodiments, a test method and also a semiconductor memory suitable therefor are proposed by means of which an electrical functional test of word line segments that does not rely on the read-out results of memory cells can be carried out. The read-out results of conventional semiconductor memories often lead to ambiguous test results, which make it more difficult to localize or identify floating word line sections. The reason for this is the conventional construction of DRAMs, in the case of which firstly a word line is activated and the memory cells assigned to the word line are in each case conductively connected up to a bit line. Sense amplifiers are in each case arranged at the end of the bit lines, the sense amplifiers detecting and amplifying the electrical signal—transmitted via the bit line—from the memory cell read. The amplified signal is on the one hand written back to the memory cell again via the bit line, and on the other hand it can be read out externally. This operation is effected simultaneously for all memory cells connected to a word line, so that, after the activation, all bit lines forward a read-out signal. On account of manufacturing tolerances and process weaknesses in the production of the memory components, particularly in the case of the through-contact connections with the aid of contact hole fillings, line portions of word lines, in particular word line segments, that are not or not reliably electrically connected, that is to say are floating during later operation, arise again and again. The floating potential—influenced by the surroundings—of word line segments that are not reliably contact-connected leads not only to the failure of the word lines themselves but also to difficult-to-reproduce and virtually unverifiable failures of those bit lines that cross the word line. The reason for this is the unforeseeable opening of the memory cells that are connected to the floating word line segment and that transfer their stored charge quantity onto the bit line at unpredictable points in time and thus corrupt read-out results during the read-out of other memory cells.

With the aid of embodiments of the present invention, the electrical contact connection of word line segments is assessed on the basis of the level of their charge-reversal current. As soon as the charge-reversal current I, to be precise either the charge-reversal current Ia upon activation of a word line segment or the charge-reversal current Id upon deactivation of a word line segment, is less than the product of the capacitance C of the word line segment 12 including its lead, insofar as it is subjected to charge reversal, and the potential difference (Vpp−Vnwll), it must be assumed that the corresponding word line segment does not have sufficiently low impedance. Consequently, with the method according to embodiments of the invention, the test result when testing word line segments can no longer be corrupted by read-out results of memory cells.

What is claimed is:

1. An integrated semiconductor memory comprising:
   at least one word line;
   a multiplicity of memory cells, each memory cell having a selection transistor coupled to the at least one word line;
   a word line driver to the at least one word line, the word line driver providing a first electrical potential or, alternatively, a second electrical potential for the word line, the word line being activated when it is coupled to the first electrical potential, and being deactivated when it is coupled to the second electrical potential; and
   a measuring device coupled to the at least one word line, wherein, in the event of the first potential or the second potential being provided, the measuring device measures a charge-reversal current or a charge quantity fed to the word line or conducted away from the word line as a result of a charge-reversal current.

2. The semiconductor memory as claimed in claim 1, wherein the measuring device has a first measuring unit that measures a charge-reversal current when the word line is activated, and a second measuring unit, which measures a charge-reversal current when the word line is deactivated.

3. The semiconductor memory as claimed in claim 2, wherein the first measuring unit and the second measuring unit each have an ohmic resistor, through which a charge-reversal current flows in the event of the word line being subjected to charge reversal, the measuring units measuring a voltage drop across the respective ohmic resistor.

4. The semiconductor memory as claimed in claim 1, wherein a measured charge-reversal current or a measured charge quantity that is fed in or conducted away on account of a charge-reversal current is amplified by the measuring device and forwarded to at least one contact terminal of the semiconductor memory.

5. The semiconductor memory as claimed in claim 4, further comprising at least one switching element that enables the forwarding of the measured charge-reversal current or the measured charge quantity to the at least one contact terminal in a test operating mode of the semiconductor memory and prevents forwarding thereof in a normal operating mode of the semiconductor memory.

6. The semiconductor memory as claimed in claim 1, wherein the at least one word line has a main word line and a plurality of word line segments coupled to the main word line, selection transistors of a respective multiplicity of the memory cells being coupled to each word line segment.

7. The semiconductor memory as claimed in claim 6, wherein each word line segment is coupled to the main word line via at least one contact hole filling.

8. The method as claimed in claim 6, wherein the word line driver has a multiplicity of driver segments, and each word line segment is coupled via a first contact hole filling to a driver segment that actively drives the word line segment, and wherein each driver segment is coupled via a second contact hole filling to the main word line.

9. The semiconductor memory as claimed in claim 8, wherein the measuring device includes separate measuring devices that are provided for each driver segment, which measuring devices are formed at a section of leads by means of which the first and the second electrical potentials are fed to the respective driver segment.

10. The semiconductor memory as claimed in claim 8, wherein the semiconductor memory has a multiplicity of word lines that are combined in groups of word lines, the word lines of a group being driven by the same driver segments, and a driver segment in each case driving a single word line segment of each word line of the group of word lines.

11. The semiconductor memory as claimed in claim 10, wherein a separate measuring device is assigned to each driver segment of a group of word lines, which measuring device measures a charge-reversal current or a charge quantity that is fed in or conducted away as a result of a charge-reversal current if a word line segment of one of the word lines of the group of word lines is activated or deactivated.

12. The semiconductor memory as claimed in claim 10, wherein a multiplicity of driver segments are arranged along main word lines of a group of word lines, which driver segments respectively drive a word line segment of each word line of the group and to which driver segments a separate measuring device is respectively assigned.

13. The semiconductor memory as claimed in claim 4, wherein the semiconductor memory, has signal lines running between at least one contact terminal, which can be contact-connected for the purpose of reading out a charge-reversal current or a charge quantity which is fed in or conducted away as a result of a charge-reversal current, and the measuring devices, the signal lines branching toward the measuring devices.

14. The semiconductor memory as claimed in claim 4, wherein the semiconductor memory has selection lines that select those measuring devices whose charge-reversal currents to be measured are forwarded to the at least one contact terminal.

15. The semiconductor memory as claimed in claim 6, wherein the main word lines comprise metallic lines and the word line segments comprise polysilicon lines.

16. The semiconductor memory as claimed in claim 1, wherein the semiconductor memory comprises a volatile random access memory.

* * * * *